(12) United States Patent
Kawai et al.

(10) Patent No.: US 8,942,001 B2
(45) Date of Patent: Jan. 27, 2015

(54) SEAL STRUCTURE FOR ELECTRONIC CONTROL DEVICE

(75) Inventors: Yoshio Kawai, Ota (JP); Yuichi Yanagisawa, Maebashi (JP); Hironori Ohhashi, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 319 days.

(21) Appl. No.: 13/609,597

(22) Filed: Sep. 11, 2012

(65) Prior Publication Data

US 2013/0070432 A1    Mar. 21, 2013

(30) Foreign Application Priority Data

Sep. 21, 2011 (JP) ................................. 2011-205474

(51) Int. Cl.
*H05K 5/06* (2006.01)
*H05K 5/00* (2006.01)

(52) U.S. Cl.
CPC .................................. *H05K 5/0052* (2013.01)
USPC ........... 361/752; 361/728; 361/729; 361/730; 174/50.5; 174/50.51; 174/50.52; 277/641; 277/642; 277/643; 277/644; 277/647; 439/76.1

(58) Field of Classification Search
CPC . H05K 5/0047; H05K 5/0052; H05K 5/0082; H01R 13/52
USPC .......................... 361/728–730, 752; 174/564, 174/50.5–50.64; 439/76.1; 277/641–644, 277/647
See application file for complete search history.

(56) References Cited

U.S. PATENT DOCUMENTS

| 6,707,678 | B2 * | 3/2004 | Kobayashi et al. | ........... 361/752 |
| 7,744,381 | B2 * | 6/2010 | Honda | ............................. 439/79 |
| 8,014,158 | B2 | 9/2011 | Kojima | |
| 8,107,251 | B2 | 1/2012 | Yamauchi | |
| 2007/0215614 | A1 * | 9/2007 | Matsui | ............................ 220/3.2 |
| 2009/0068862 | A1 | 3/2009 | Honda | |

FOREIGN PATENT DOCUMENTS

| JP | 2009-70855 A | 4/2009 |
| JP | 2009-123558 A | 6/2009 |

(Continued)

OTHER PUBLICATIONS

U.S. Appl. No. 13/609,555, filed Sep. 11, 2012.
(Continued)

*Primary Examiner* — Robert J Hoffberg
*Assistant Examiner* — Mukund G Patel
(74) *Attorney, Agent, or Firm* — Crowell & Moring LLP (57) ABSTRACT

A seal structure for an electronic control device having a circuit board housed in a watertight space a housing that is formed by fitting a plurality of fitting members together, has first and second seal portions which are formed at a fitting surface portion between the fitting members that are fitted together. One side of a pair of the fitting members of each of the first and second seal portions is provided with a seal groove, the other side is provided with a protruding line. An auxiliary seal groove and an auxiliary protruding line are formed on opposing surfaces of the seal groove and the protruding line at a merged part where the first and second seal portions meet each other. The auxiliary seal groove and the auxiliary protruding line continuously extend from the seal groove up to an end surface of the protruding line.

3 Claims, 12 Drawing Sheets

(56) References Cited

FOREIGN PATENT DOCUMENTS

| JP | 2009-230925 A | 10/2009 |
|----|---------------|---------|
| JP | 2010-258360 A | 11/2010 |
| JP | 2011-49312 A  | 3/2011  |
| JP | 2011-60618 A  | 3/2011  |

OTHER PUBLICATIONS

U.S. Appl. No. 13/609,684, filed Sep. 11, 2012.
Japanese language Notice of Allowance dated Apr. 15, 2014 (Three (3) pages).

* cited by examiner

SEAL STRUCTURE FOR ELECTRONIC CONTROL DEVICE

BACKGROUND OF THE INVENTION

The present invention relates to a seal structure for an electronic control device, which is favorable for an engine control unit or an automatic transmission control unit.

As an example of the seal structure for the electronic control device, it is disclosed in Japanese Patent Provisional Publication No. 2009-070855 (hereinafter is referred to as "JP2009-070855"). In JP2009-070855, the seal structure of a so-called connector-side-mounted type of electronic control device, in which a part of the connector fixed to one side of a circuit board is exposed to an outside of a casing from a window of the casing, is disclosed. Both upper and lower surfaces of the connector are sandwiched between and by a pair of connector sandwiching members of the casing from width direction of the circuit board. A casing seal portion, which is filled with a sealing material, is provided at a fitting surface portion between periphery edge portions of the pair of connector sandwiching members. Likewise, a connector seal portion, which is filled with the sealing material, is provided at a fitting surface portion between an outer peripheral surface of the connector and an inner peripheral surface of the casing. The casing seal portion is formed by a seal groove and a protruding line which are provided respectively at one side and the other side of the pair of connector sandwiching members, also the connector seal portion is formed by a seal groove and a protruding line which are provided respectively at one side and the other side of the connector and the casing so as to secure a predetermined seal length (also called a leak path). A U-shaped gap, whose cross section is U-shape, formed between these seal groove and protruding line is filled with the sealing material.

SUMMARY OF THE INVENTION

In JP2009-070855, in the case of the seal structure for the electronic control device in which a part of the connector is exposed to the outside of the casing, in order to ensure sealing performance of an inside of the casing, besides providing the casing seal portion at the periphery edge portions of the connector sandwiching members, the connector seal portion is provided also at a circumference of the connector. Then, these casing seal portion and connector seal portion are united or merged with each other at a part where the both connector sandwiching members are fitted together at the circumference of the connector. In this case, however, since a seal structure of this merged part is a so-called three-way seal structure in which the two seal portions, both of which are an endless extending ring-shaped seal portion, meet or cross at this merged part, it is difficult to ensure the sealing performance.

It is therefore an object of the present invention to provide a seal structure for the electronic control device, which is capable of ensuring the sealing performance of the merged part of the two seal portions.

According to one aspect of the present invention, a seal structure for an electronic control device having a circuit board housed in a watertight space of an inside of a housing that is formed by fitting a plurality of fitting members together, the seal structure comprises: first and second seal portions which are formed at a fitting surface portion between the fitting members that are fitted together, one side of a pair of the fitting members of each of the first and second seal portions being provided with a seal groove, the other side being provided with a protruding line, and a gap defined by fitting of the seal groove and the protruding line being filled with a sealant; and an auxiliary seal groove and an auxiliary protruding line which are formed on opposing surfaces of the seal groove and the protruding line at a merged part where the first and second seal portions meet each other at a predetermined angle, and are fitted together with a predetermined gap provided between the auxiliary seal groove and the auxiliary protruding line.

The other objects and features of this invention will become understood from the following description with reference to the accompanying drawings.

BRIEF DESCRIPTION OF THE DRAWINGS

FIGS. 5A, 5B and 5C are sectional views of a connector seal portion under the assembly, of the embodiment.

DETAILED DESCRIPTION OF THE INVENTION

According to the present invention, besides providing a normal seal groove and a normal protruding line, an auxiliary seal groove and an auxiliary protruding line are provided at a merged part where two seal portions meet, and a gap between these auxiliary seal groove and auxiliary protruding line is filled with a sealant. It is therefore possible to secure an equivalent seal length by the same quantity of sealant as that of a normal seal portion, and decrease of the sealing performance of this merged part can be suppressed or avoided.

Embodiments of a seal structure for the electronic control device of the present invention will now be explained below with reference to the drawings.

In the following description, a case where the seal structure for the electronic control device is employed in an engine control unit of a vehicle will be explained in detail.

First, a basic configuration of an electronic control device 10 will be explained with reference to FIGS. 1 and 2. Here, for convenience of the explanation, an up-and-down direction (a vertical direction) in FIG. 1, i.e. a thickness direction of a circuit board 11, is defined as an up-and-down direction (a vertical direction) and a height direction of the electronic control device 10. However, this direction does not necessarily correspond to a vertical direction when mounted in the vehicle.

The electronic control device 10 mainly has a housing formed by a substantially plate-shaped case 12 and a substantially box-shaped cover 13 and the circuit board 11 on which an electron element or component (or electronic parts) 14 is mounted. The case 12 that is fixed to a vehicle body side and the cover 13 are liquid-tightly fitted together, then the housing having the liquid tightness is formed. The circuit board 11 (the electronic parts 14) is housed in a watertight space of an inside of the housing. The electronic control device 10 is installed inside an engine room (not shown) etc. with a clamping or mounting flat surface 19, which is a bottom surface of the case 12, fixed to the vehicle body side.

Each element or component will be explained in more detail. The circuit board 11 is a so-called printed circuit board that mounts some electronic parts 14 on its front and/or back surfaces. Wiring circuit pattern is formed on plate-shaped front and/or back surfaces made of e.g. glass epoxy resin or is formed inside the front and/or back surfaces, then the electronic parts 14 are electrically connected to the wiring circuit pattern with solder. As the electronic parts 14, for instance, they are a capacitor, a coil, a transistor, an IC and so on. In FIG. 1, for the sake of convenience, only electronic parts 14 whose heat-generation is relatively high (e.g. MOS-FET and IC) are illustrated.

Figure 1:
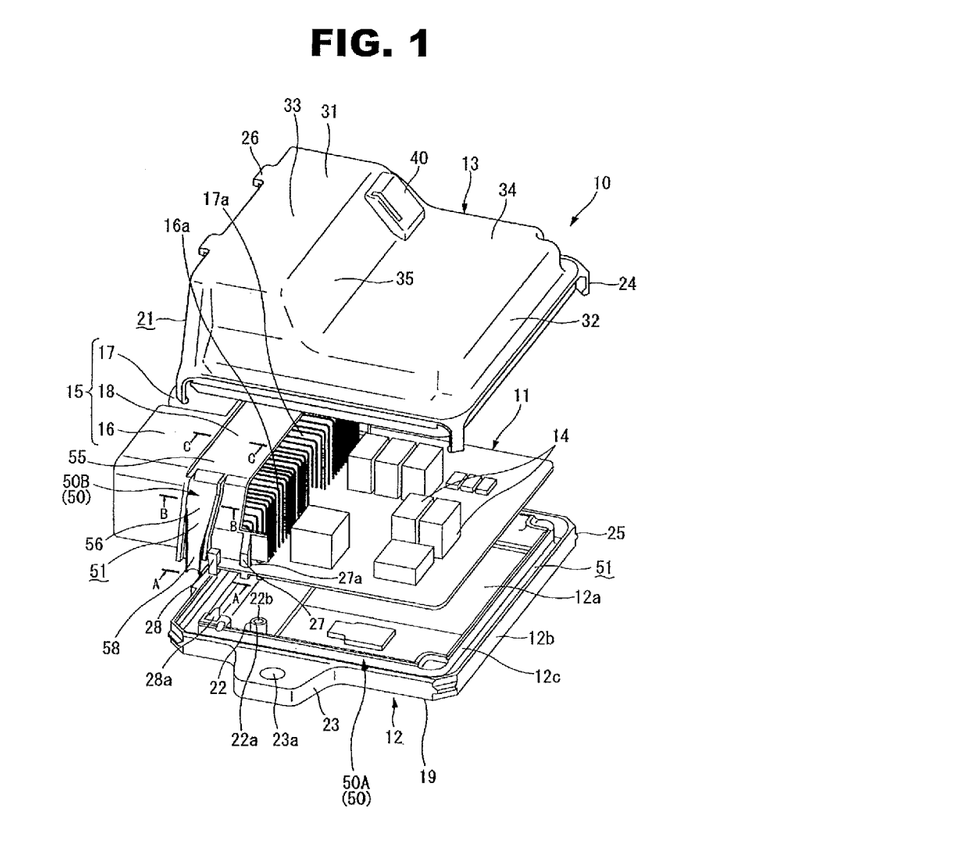
FIG. 1 is a perspective exploded view of an electronic control device that employs a seal structure of an embodiment of the present invention.

As shown in FIG. 1, a surface-mounted-type of connector 15 having first and second connecting opening ends 16 and 17 is attached or fixed to one side of the circuit board 11. Two of the first and second connecting opening ends 16, 17 are connected to respective external connectors. This connector 15 is a connector that is made of synthetic resin by which the two connecting opening ends 16, 17 split according to the external connectors are integrally joined together through a joining base 18. The connector 15 is fixed to the circuit board 11 through this joining base 18 with a plurality of screws etc. The connector 15 is arranged so that a series of connecting opening ends 16, 17 joined by the joining base 18 face an outside through a window 21 that is an opening formed between the case 12 and the cover 13. The connecting opening ends 16, 17 are connected to the respective external connectors (not shown) at this window 21. These connecting opening ends 16, 17 and the joining base 18 of the connector 15 are integrally formed together by synthetic resin material.

The connector 15 is provided with a plurality of male terminals 16a and 17a that are electrically connected to the wiring circuit pattern on the circuit board 11. These male terminals 16a, 17a are respectively connected to a plurality of female terminals housed in the external connectors (not shown), the connector 15 is thus electrically connected to sensors and equipment such as a pump, each of which is connected to the external connector (the female terminal).

The joining base 18 of the connector 15 is provided with a positioning protrusion 27 that is inserted into a positioning hole 27a formed on the circuit board 11. Further, the joining base 18 is provided with a positioning protrusion 28 that is fitted into a positioning recessed portion 28a formed in the case 12.

The case 12 is a case that is formed into the substantially plate-shape by metal material such as iron and aluminum having excellent heat-dissipation. More specifically, the case 12 is formed, as an integral part, into such a shallow-bottomed box-shape that a periphery edge of the case 12 slightly stands. As shown in FIG. 1, a side wall 12b is formed at an outer periphery edge (at each side) of a substantially rectangular bottom wall 12a in such a manner that the whole of case 12 slightly opens upwards.

Further, a board fixing portion 22 for fixing the circuit board 11 is provided on an inner side surface of the bottom wall 12a of the case 12. The board fixing portion 22 has, on an upper end thereof, a flat supporting surface 22a that supports the circuit board 11, and a female screw hole 22b into which a screw (not shown) is screwed for fixing the circuit board 11 is formed at the supporting surface 22a. The screw is screwed into each female screw hole 22b, thereby fixing the circuit board 11 to the case 12 with the circuit board 11 supported by each board fixing portion 22.

Furthermore, a pair of brackets 23 for fixing the electronic control device 10 to the vehicle body (not shown) are formed integrally with an outer side part of the side wall 12b of the case 12. Here, in FIG. 1, only one bracket 23 positioned at a front side in the drawing is illustrated. The bracket 23 is provided with a penetration hole 23a that penetrates the bracket 23 in the vertical direction and a cutting groove that opens towards the side of the case 12. The electronic control device 10 is fixed to the vehicle body side with a bolt that is inserted in the penetration hole 23a and the cutting groove.

The cover 13 is a cover that is formed, as an integral part, into the substantially box-shape by certain synthetic resin material that is light and low cost as compared with metal material. The cover 13 has an upper wall 31 that covers an upper side of the circuit board 11 and an upper side of the connector 15 and a side wall 32 that surrounds three sides of a periphery edge of the upper wall 31 except the window 21. A stopper hook 24 provided at each of four corners of the cover 13 is fitted onto a protrusion 25 provided at each of four corners of the case 12 by elastic deformation of the stopper hook 24, and also each connector stopper hook 26 provided at two positions of a periphery edge of the window 21 is fitted onto a protrusion (not shown) provided at the connector 15 side by elastic deformation of the connector stopper hook 26. The cover 13 is then firmly attached or secured to the case 12 and the circuit board 11 including the connector 15. A fixing structure of the cover 13 is such snap-fit type fixing structure as described above.

As explained above, in the present embodiment, as the fixing structure of the housing, the snap-fit type fixing structure which is a simple structure using the elastic deformation of the synthetic resin cover 13 is employed. However, the fixing structure is not limited to this structure. For instance, other fixing structure using a screw or a bolt could be used.

This electronic control device 10 employs a so-called connector-side-mounted structure in which a part of the connector 15 fixed to the one side of the circuit board 11 penetrates the window 21 provided at a side of the housing and is exposed to an outside of the housing. Because of this structure, the cover 13 has a stepped shape according to heights of the circuit board 11 and the connector 15 whose sizes (heights) in the thickness direction of the circuit board are different from each other. More specifically, the upper wall 31 of the cover 13, which faces the case 12 so as to sandwich the circuit board 11 and the connector 15, has an upper section 33 and a lower section 34, each of which is parallel to the mounting flat surface 19 of the case 12. A size (height) in the thickness direction of the circuit board of the upper section 33 that covers the upper side of the connector 15 is set to be larger (or higher) than that of the lower section 34 that covers the upper side of the circuit board 11. The upper wall 31 further has a sloped wall section 35 that smoothly or seamlessly unites these upper and lower sections 33 and 34 having different height. This sloped wall section 35 has a predetermined inclination angle with respect to the mounting flat surface 19 of the case 12. More specifically, the sloped wall section 35 inclines at a substantially 45-degree flat inclination angle. Therefore, the sloped wall section 35 inclines at the same inclination angle with respect to the upper section 33 and the lower section 34.

The sloped wall section 35, which serves as part of an exterior wall of the housing, is provided with a protection wall 40. An air vent (not shown) for ventilation of the inside of the housing is formed at an inner side of the protection wall 40 so as to penetrate the sloped wall section 35 in the thickness direction. The air vent is provided with a breathable waterproof thin film such as Gore-Tex (registered trademark) which has both water-resistance and air-permeability. The protection wall 40 covers the air vent and its surroundings in order to prevent the breathable waterproof thin film from being directly sprayed with high temperature-high pressure water during car wash etc.

Next, the seal structure of the present embodiment will be explained with reference to FIG. 1 to FIG. 5C etc. In order to ensure the water-resistance of the inside of the housing, a seal portion 50 which is filled with a sealing material (sealant) is provided at a fitting surface portion between the components. More specifically, an endless ring-shaped housing seal portion 50A (a first seal portion) filled with the sealant is provided at a fitting surface portion that is a mating surface portion between the periphery edge of an upper surface side of the case 12 and the periphery edge of a lower surface side of the cover 13 throughout the entire circumference of the housing. In addition, an endless ring-shaped connector seal portion 50B (a second seal portion) filled with the sealant is also provided at a fitting surface portion between an outer peripheral surface of the connector 15 and an inner peripheral surface of the window 21 of the housing throughout the entire circumference of the connector 15. The housing seal portion 50A and the connector seal portion 50B are a common seal portion at a lower surface side of the connector 15. That is, the seal portion 50 positioned under the connector 15 serves as a part of the housing seal portion 50A and also as a part of the connector seal portion 50B.

As the sealant, its constituent element is not specially limited as long as the sealant has fluidity. For example, epoxide sealant, silicon sealant and acrylic sealant could be selected as the sealant in accordance with specs or requirements of the electronic control device 10.

Regarding the housing seal portion 50A, a channel-shaped seal groove 51 which is shaped like a square bracket ([) in cross section is formed at the case 12 side throughout the entire circumference of the case 12. Further, a band-shaped protruding line 52 whose cross section is a rectangle is formed at the lower surface side of the cover 13 and the lower surface side of the connector 15. This protruding line 52 is fitted in the seal groove 51 with a predetermined gap provided between the protruding line 52 and the seal groove 51. This gap is a U-shaped gap (U-shaped cross section gap, whose cross section is U-shape), and a sealing material (sealant) 53 fills this U-shaped gap.

Figure 2:
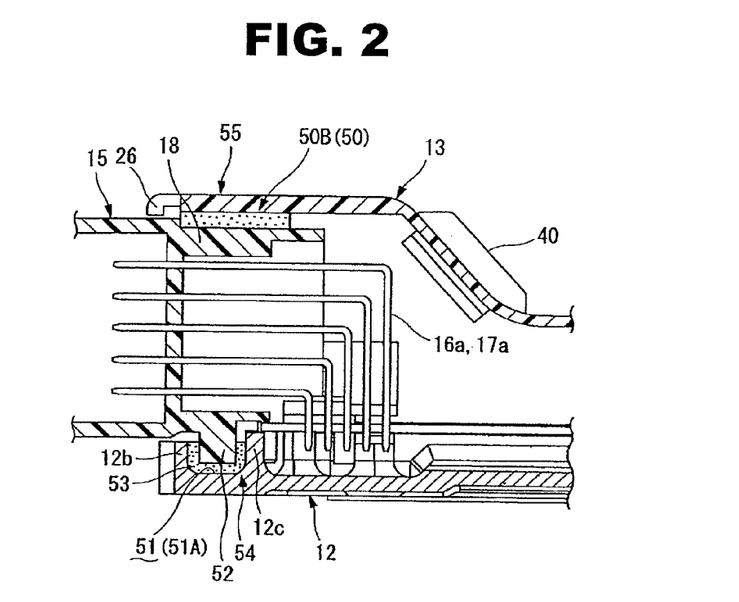
FIG. 2 is a sectional view showing the seal structure of a connector part, of the embodiment.
Figure 3:
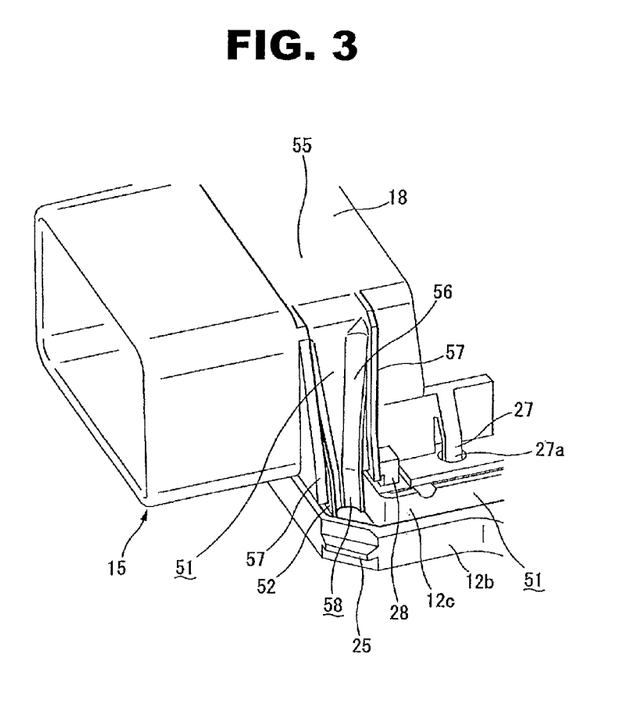
FIG. 3 is a perspective view showing the seal structure of the connector part, with a cover removed, of the embodiment.
Figure 4:
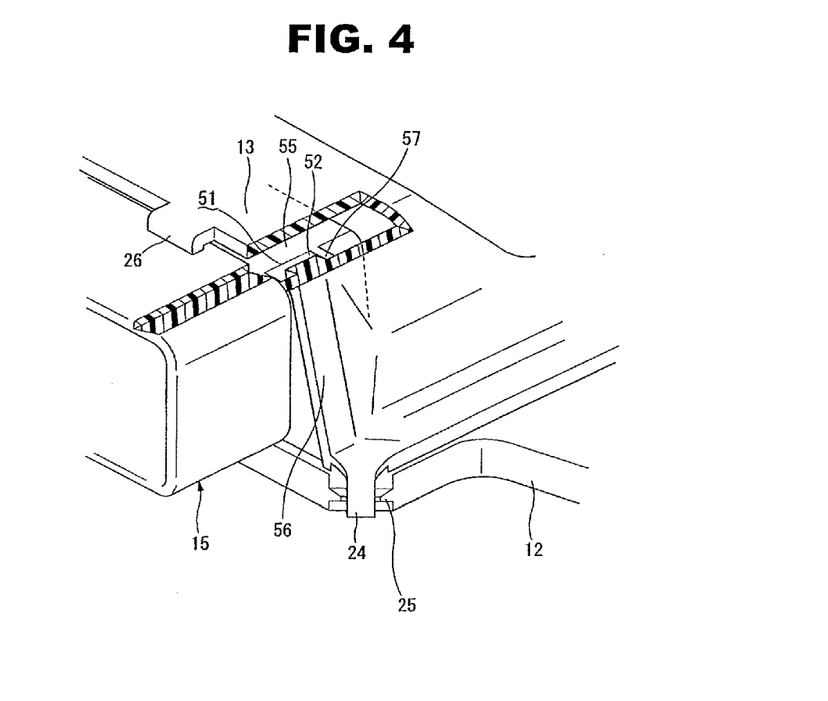
FIG. 4 is a perspective view showing the seal structure of the connector part, with parts of the cover and the connector shown by cutaway, of the embodiment.

As shown in FIGS. 1 and 2, the seal groove 51 formed at the case 12 is defined between the side wall 12b of the case 12 and an auxiliary wall 12c that stands from the bottom wall 12a at an inner peripheral side of the side wall 12b. On the other hand, the protruding line 52 formed at the cover 13 is formed as an integral part upon molding the synthetic resin cover 13, and protrudes downwards from the lower surface of the cover 13. Likewise, the protruding line 52 formed at the connector 15 is formed as an integral part upon molding the synthetic resin connector 15, and protrudes downwards from a lower surface of the joining base 18 of the connector 15.

In this manner, the seal portion 50 is provided with the seal groove 51 and the protruding line 52, and the cross section of the gap filled with the sealant 53 is shaped into the U-shape, thereby securing a sufficient seal length (also called a leak path) and getting intended or desired sealing performance.

With respect to the housing seal portion 50A, a depth and a width of each of the seal groove 51 and the protruding line 52 are set to be substantially uniform throughout the entire circumference so as to secure a predetermined constant seal length.

Here, the "seal length" corresponds a filling length of the sealant existing between two gaps that are separated by the seal portion 50. For instance, in FIG. 5A, the seal length corresponds a length (R2+(R1×2)) obtained by developing or converting the U-shaped gap filled with the sealant 53 to a linear length.

As for the connector seal portion 50B, as same as the housing seal portion 50A, the seal groove 51 and the protruding line 52 are formed. Under the connector 15 (at the lower surface side of the connector 15) where the connector seal portion 50B serves also as a part of the housing seal portion 50A (and vice versa), as shown in FIG. 2, the protruding line 52 is provided at the connector 15 side, then this protruding line 52 is fitted in the seal groove 51 (51A) formed at the case 12. On the other hand, regarding surfaces (connector both sides) except the lower surface side of the connector 15, the seal groove 51 is formed at the connector 15 side, and the protruding line 52 is formed at the cover 13 side which faces this seal groove 51.

Figures 5A, 5B:
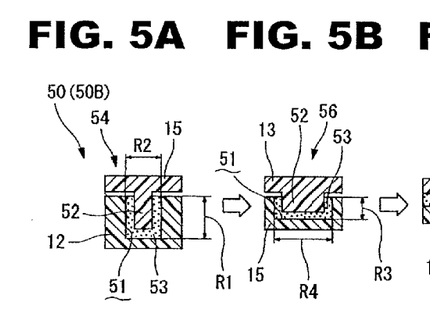
FIG. 5A is a sectional view, taken along an A-A line of FIG. 1, of a lower surface side of the connector.
FIG. 5B is a sectional view, taken along a B-B line of FIG. 1, of a side surface side of the connector.
Figure 5C:
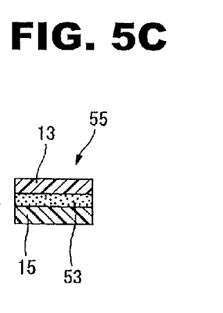
FIG. 5C is a sectional view, taken along a C-C line of FIG. 1, of an upper surface side of the connector.

FIGS. 5A, 5B and 5C are sectional views of the connector seal portion 50B under the assembly. FIG. 5A is a sectional view, taken along an A-A line of FIG. 1, of the lower surface side of the connector 15. FIG. 5B is a sectional view, taken along a B-B line of FIG. 1, of the side surface side of the connector 15. FIG. 5C is a sectional view, taken along a C-C line of FIG. 1, of an upper surface side of the connector 15.

In the present embodiment, a shape and a size of each of the seal groove 51 and the protruding line 52 of the connector seal portion 50B are set to be different according to its position. That is, as shown in FIG. 5A, the lower surface side of the connector 15 is provided with a deep bottom portion 54 which has the seal groove 51 having a predetermined depth R1 and a predetermined width R2 and the band-shaped protruding line 52 fitted in this seal groove 51 with a gap provided between them. An inner surface of the seal groove 51 and an outer surface of the protruding line 52 of the deep bottom portion 54 face each other with a predetermined gap provided between them, then this U-shaped gap is filled with the sealant 53.

On the other hand, as shown in FIG. 5C, the upper surface side of the connector 15 is provided with a shallow bottom portion 55 whose seal groove and protruding line are set to be shallower than those of the deep bottom portion 54 formed at the lower surface side of the connector 15. Especially in the present embodiment, the depth of the seal groove is set to 0 (zero), namely that the seal groove is substantially omitted, and the protruding line fitted in the seal groove is also omitted. Thus, the upper surface side of the connector 15 which would be provided with the shallow bottom portion 55 is sealed by a so-called flat surface seal structure in which a flat band-shaped gap between the outer peripheral surface of the connector 15 and the opposing inner peripheral surface of the cover 13 of the housing is filled with the sealant 53.

As for the both sides of the connector 15, as shown in FIG. 5B, the side surface side of the connector 15 is provided with, at both sides thereof, a connecting portion 56 which connects the connector lower surface side deep bottom portion 54 and the connector upper surface side shallow bottom portion 55.

The deep bottom portion 54, the shallow bottom portion 55 and the connecting portion 56 are set in such a manner that the seal length of the connector seal portion 50B is constant throughout the entire circumference of the connector seal portion 50B (namely that the seal lengths at the deep bottom portion 54, the shallow bottom portion 55 and the connecting portion 56 are set so as to be constant). This will be explained in more detail. The widths of the seal groove and the protruding line of the shallow bottom portion 55 are set to be large as compared with the deep bottom portion 54 so that the both seal lengths are constant.

Further, regarding the connecting portion 56, as a position of the seal groove 51 gets closer to the deep bottom portion 54 from the shallow bottom portion 55, a depth R3 of the seal groove 51 is set to be gradually larger (deeper) (R3<R1), and a width R4 of the seal groove 51 is set to be gradually smaller (R4>R2).

As shown in FIG. 3 and FIGS. 7 to 9, the side surface of the connector 15 is provided with a pair of ribs 57 that are formed as an integral part and overhang outwards. The seal groove 51 is formed between these ribs 57. Each of the ribs 57 has such substantially triangular-shape that an overhanging depth is gradually deeper towards the connector lower surface from the connector upper surface. A top of the rib 57 smoothly continues to the connector upper surface.

Further, an inner side of the seal groove 51 is provided with a further deeply hollow auxiliary seal groove 58, then the inner side of the seal groove 51 has a stepped shape in cross section. The auxiliary seal groove 58 is gradually deeper towards the connector lower surface, and continuously extends up to portions of both end surfaces of the connector lower surface protruding line 52 (52C) fitted in the seal groove 51 of the case 12, then opens at a lower end of this protruding line 52.

Figure 9:
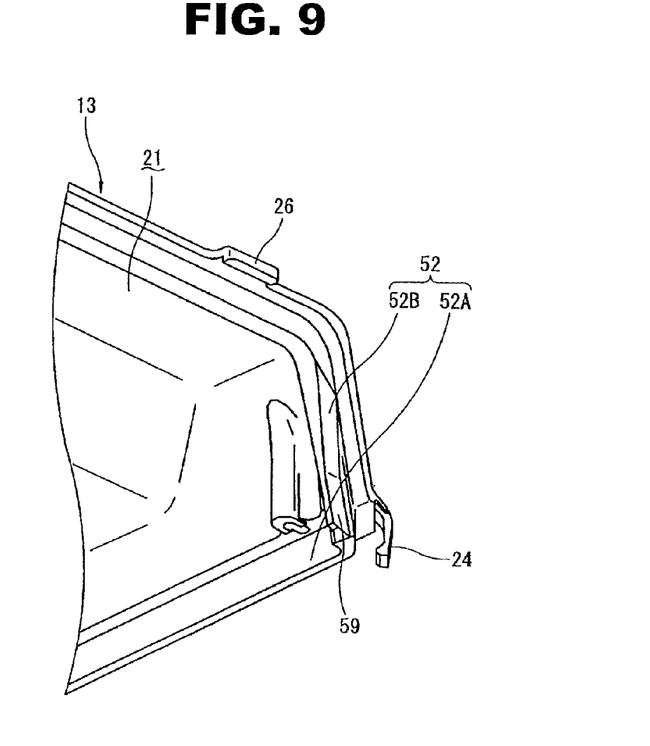
FIG. 9 is a perspective view showing the seal structure of the merged part, with only the cover drawn out, of the embodiment.

The protruding line 52 (52B) protruding inwards from the inner peripheral surface of the window 21 of the cover 13 is provided with an auxiliary protruding line 59 that partly further protrudes inwards so as to fit into the auxiliary seal groove 58. As shown in FIG. 9, a width of the protruding line 52 (52B) at a side surface side of the window 21 of the cover 13 is gradually thinner towards the lower side in accordance with the shapes of the seal groove 51 and the auxiliary seal groove 58 of the side surface side of the connector 15, and smoothly continues to the auxiliary protruding line 59 that is fitted in the auxiliary seal groove 58.

Figure 6A:
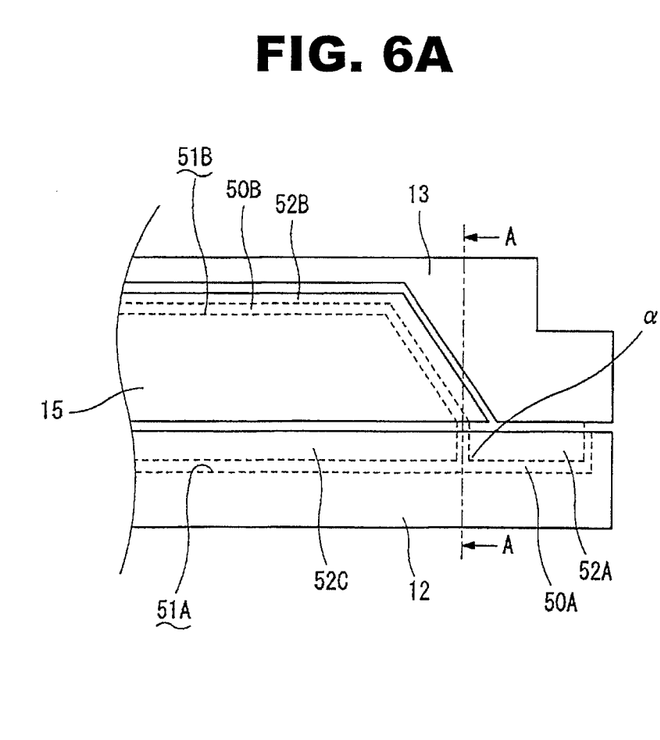
FIG. 6A is a sectional view, along the connector seal portion, showing a housing seal portion and the connector seal portion.
Figure 8:
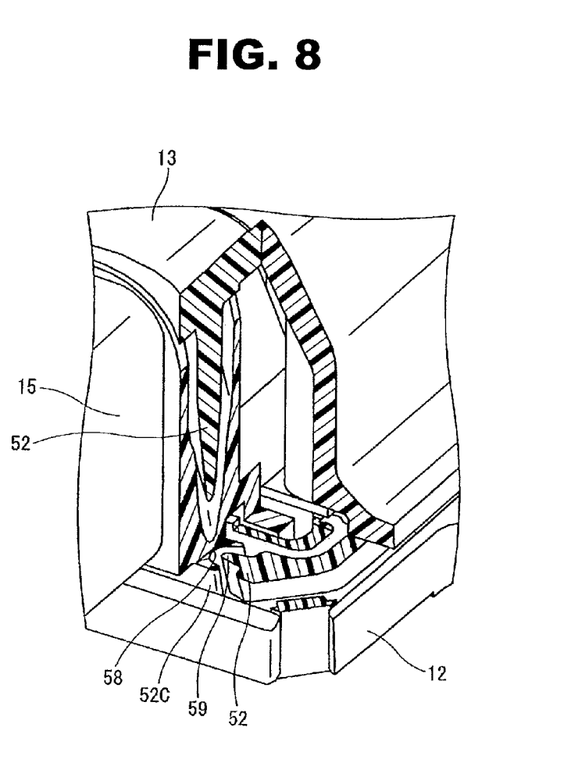
FIG. 8 is a perspective view showing the seal structure of the merged part, with parts of the cover, the connector and a case shown by cutaway, of the embodiment.

FIG. 6A is a sectional view of the connector seal portion 50B, the cover 13 and the case 12, cut along the connector seal portion 50B. As shown in FIG. 6A, regarding the housing seal portion 50A, the periphery edge of the upper surface side of the case 12, which is one of a pair of connector sandwiching members that sandwich the connector 15 in the thickness direction, is provided with the recessed seal groove 51A (51) throughout the entire circumference of the case 12. On the other hand, as shown in FIGS. 8 and 9 too, the cover 13, which is the other of a pair of connector sandwiching members, is provided with the endless ring-shaped protruding line 52 from the periphery edge of the lower surface side of the cover 13 to an opening periphery edge of the window 21. A part (the protruding line) 52A of this protruding line 52, which is formed at the periphery edge of the lower surface side of the cover 13, is fitted in the seal groove 51A of the case 12, and a part (the protruding line) 52B of the protruding line 52, which is formed at the opening periphery edge of the window 21, is fitted in a seal groove 51B formed at the outer periphery of the connector 15.

With regard to the connector 15, the endless ring-shaped seal groove and the endless ring-shaped protruding line are not formed, but the seal groove and the protruding line are formed separately according to its position. That is, the connector lower surface is provided with the protruding line 52C that is fitted in the seal groove 51A of the case 12, while the connector side surface and the connector upper surface, except the connector lower surface, are provided with the recessed seal groove 51B. Then, the protruding line 52B formed at the opening periphery edge of the window 21 of the cover 13 is fitted in this seal groove 51B. Here, for convenience of the explanation, in FIG. 6A, the seal groove 51B is illustrated with the seal groove 51B formed also at the connector upper surface.

As described above, a structure of the housing seal portion 50A is such that the protruding line 52A of the lower surface periphery edge of the cover 13 and the protruding line 52C of the connector lower surface, which is arranged so as to range with the protruding line 52A, are respectively fitted in the endless ring-shaped seal groove 51A formed throughout the entire periphery edge of the upper surface side of the case 12.

On the other hand, as for a structure of the connector seal portion 50B, regarding the connector lower surface side that serves also as a part of the housing seal portion 50A, the protruding line 52C of the connector 15 is fitted in the seal groove 51A of the case 12. Regarding the side surface sides and the upper surface side except the connector lower surface, the protruding line 52B formed at the periphery edge of the window 21 of the cover 13 is fitted in the seal groove 51B of the connector 15.

The connector seal portion 50B and the housing seal portion 50A are joined so as to meet or cross each other at a predetermined angle (substantially 90 deg.) at a merged part α where the case 12 and the cover 13 are fitted together at the circumference of the connector 15, namely that the connector seal portion 50B is substantially vertically joined or connected to the housing seal portion 50A, then a three-way seal structure is formed. It is difficult, at this merged part α, to ensure the same sealing performance as that of a normal seal portion. That is, regarding the normal seal portion except the merged part, the sealant rounds in the U-shape in the U-shaped gap defined between the seal groove and the protruding line and fills this U-shaped gap, thereby securing a specified seal length. However, regarding the merged part α where the two seal portions are joined, the seal groove and the protruding line of at least one of the two seal portions can not continuously be formed, then a part that lacks a fitting structure between and by the seal groove and the protruding line appears. For this reason, it is difficult to secure the same seal length as that of the normal seal portion.

Figure 6B:
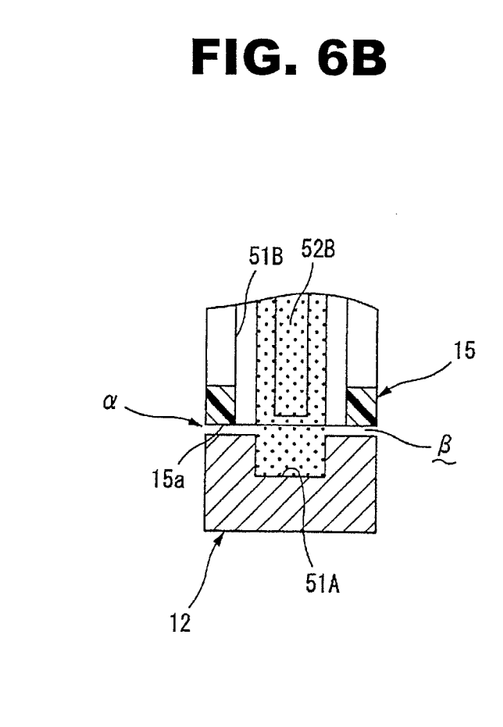
FIG. 6B is a sectional view, taken along an A-A line of FIG. 6A.
Figure 10:
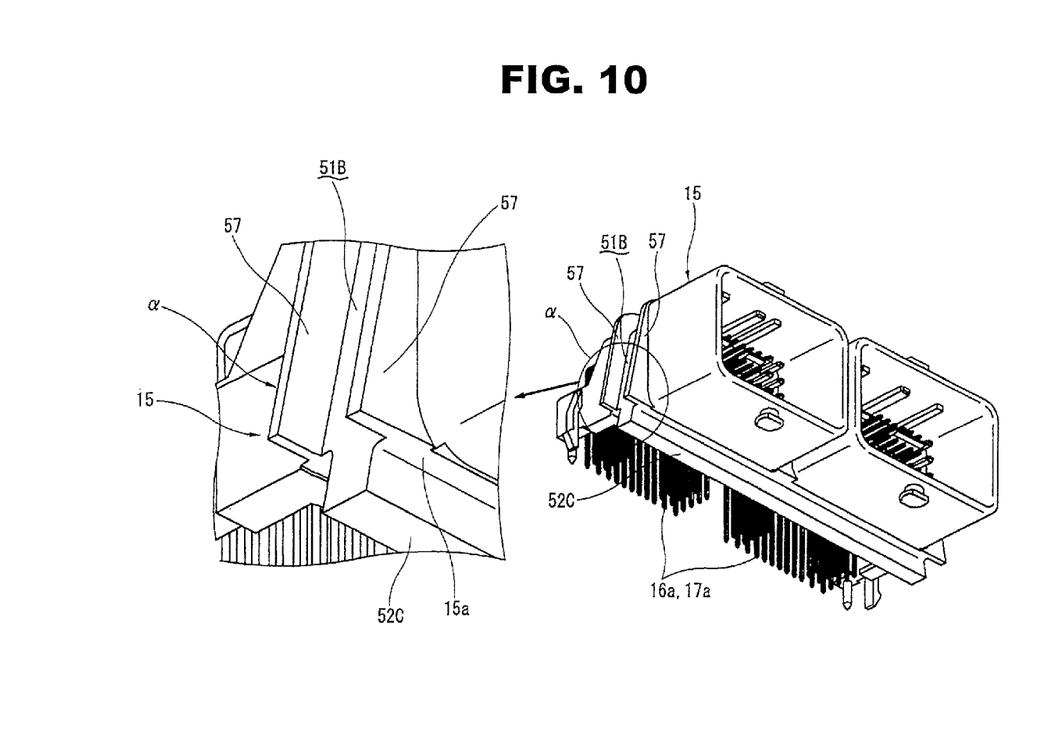
FIG. 10 is a perspective view showing a seal structure of a merged part, with only a connector drawn out, of a comparative example.
Figure 11:
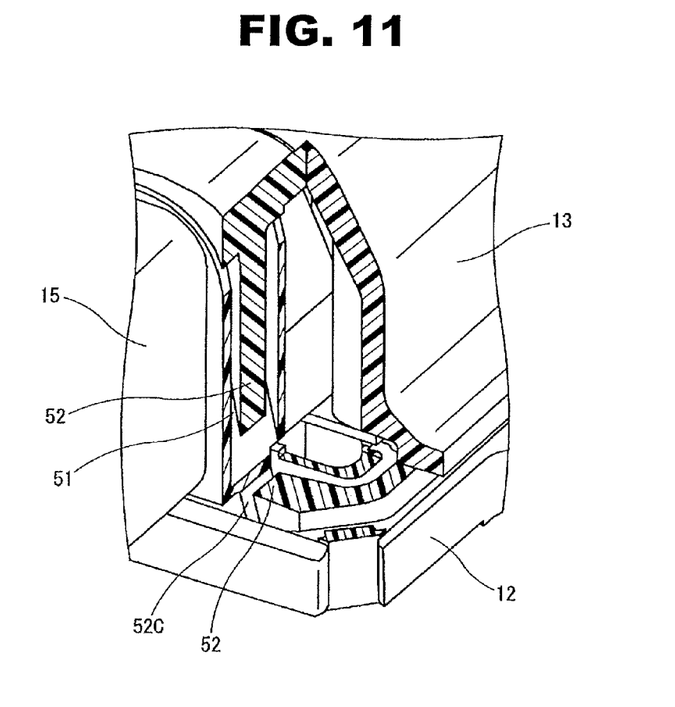
FIG. 11 is a perspective view showing the seal structure of the merged part, with parts of a cover, the connector and a case shown by cutaway, of the comparative example.
Figure 12:
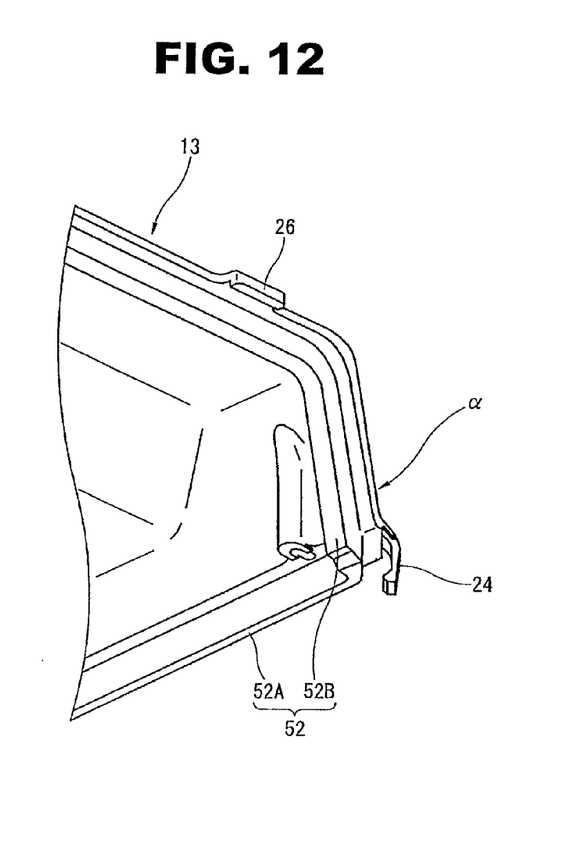
FIG. 12 is a perspective view showing the seal structure of the merged part, with only the cover drawn out, of the comparative example.

This point will be explained in more detail with reference to a comparative example shown in FIGS. 10 to 12. FIGS. 10 to 12 are drawings that correspond to FIGS. 7 to 9 of the present embodiment. The comparative example has no auxiliary seal groove and no auxiliary protruding line. This is different from the present embodiment. In such comparative example, since a shape changes between the connector side surface seal groove 51 and the connector lower surface protruding line 52 of the connector 15 at the merged part α, as shown in FIG. 6B, the fitting structure between and by the seal groove 51 and the protruding line 52 can not be obtained at a space β between the upper surface of the case 12 and the lower surface of the connector 15. Since the relatively large space β appears, despite the fact that an extra quantity of the sealant is required, only the seal length equivalent to the width of the seal groove 51 can be substantially obtained. Hence, as compared with the part where the U-shaped gap between the seal groove 51 and the protruding line 52 is filled with the sealant, increase in quantity of the sealant and decrease in the sealing performance could occur.

Figure 7:
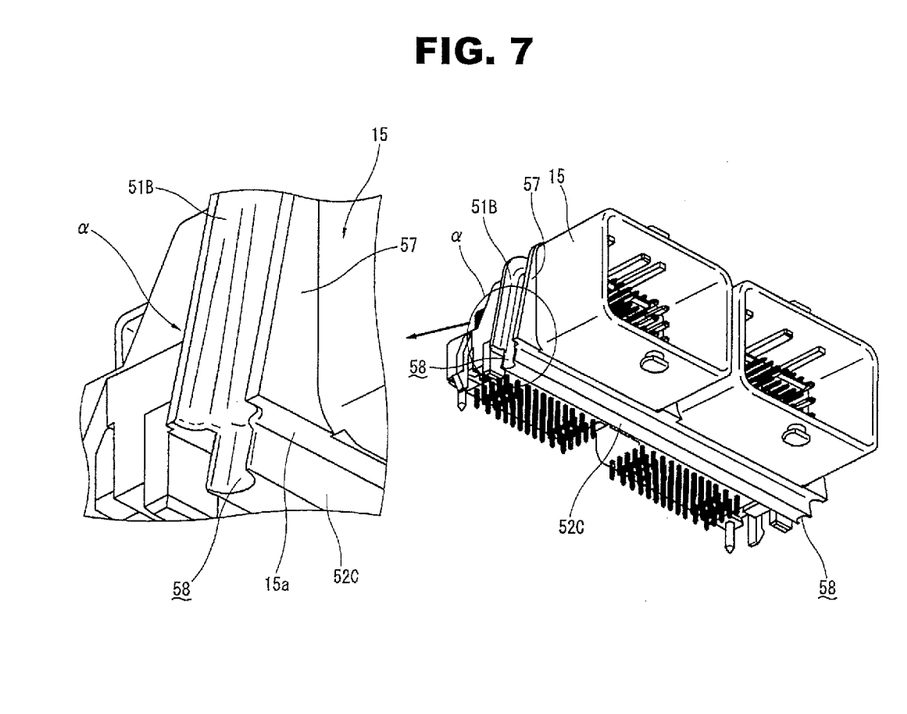
FIG. 7 is a perspective view showing the seal structure of a merged part, with only the connector drawn out, of the embodiment.

In contrast to this, in the present embodiment, as shown in FIG. 7, the further deeply hollow auxiliary seal groove 58 is formed in a width direction middle of the seal groove 51B of the connector 15 at the merged part α, and this auxiliary seal groove 58 continuously extends up to the end surface of the protruding line 52C formed at the connector lower surface side. That is, the auxiliary seal groove 58 crosses a lower surface 15a of the connector 15 and extends up to the portion of the end surface of the protruding line 52C protruding downwards from the lower surface 15a of the connector 15, and opens at the lower end of this protruding line 52. In other words, the thin-wide auxiliary seal groove 58, whose width is thinner than the seal groove 51, is formed at an inner side of the seal groove 51 so as to be able to form the auxiliary seal groove 58 also at the end surface of the protruding line 52C whose width is thinner than the seal groove 51. Then, this auxiliary seal groove 58 continuously extends up to the end surface of the protruding line 52C from the seal groove 51.

Further, as shown in FIG. 9, the auxiliary protruding line 59 further protruding inwards in the width direction middle is also formed at the protruding line 52 of the cover 13, and this auxiliary protruding line 59 is fitted in the auxiliary seal groove 58 throughout the entire length of the auxiliary protruding line 59 with a predetermined gap provided between them. The auxiliary protruding line 59 has such shape that its width is gradually thinner and its protruding depth is gradually deeper towards the lower side in accordance with the shape of the auxiliary seal groove 58. Then, the protruding line 52A of the lower surface periphery edge of the cover 13, fitted in the seal groove 51 of the case 12, is bent and joined to a lower end portion of the auxiliary protruding line 59 fitted in the recessed auxiliary seal groove 58 formed at the end surface of the protruding line 52C.

With this structure, even at no-seal groove portion under the lower surface 15a of the connector 15 at the merged part α, the auxiliary seal groove 58 remains or exists at the end surface of the protruding line 52C protruding downwards from the connector lower surface 15a. Then, by the fact that the auxiliary protruding line 59 is fitted in this auxiliary seal groove 58, the fitting structure between and by these auxiliary seal groove 58 and auxiliary protruding line 59, which covers the space β between the lower surface of the connector 15 and the upper surface of the case 12, can be obtained. The U-shaped gap formed between the auxiliary seal groove 58 and the auxiliary protruding line 59 is filled with the sealant, thereby securing the sufficient seal length even by a small quantity of the sealant.

As explained above, in the present embodiment, since the merged part α, where the two seal portions 50A, 50B are joined, also has the fitting structure between and by the auxiliary seal groove 58 and the auxiliary protruding line 59, it is possible to secure the same seal length as that of the normal seal portion having the fitting structure by the seal groove 51 and the protruding line 52. Hence, the specified seal length can be secured throughout the entire length of the housing seal portion 50A and the connector seal portion 50B including the merged part α of the three-way seal structure.

Especially in the present embodiment, the shapes and sizes of the auxiliary seal groove 58 and the auxiliary protruding line 59 at the merged part α are set so that the quantity of the sealant filling the gap between the auxiliary seal groove 58 and the auxiliary protruding line 59 and the seal length of this gap at the merged part α are substantially same as those of the gap between the seal groove 51 and the protruding line 52 except the merged part α. Thus, it is possible, even at the merged part α, to secure the predetermined or constant seal length by the same quantity of sealant as that of the normal seal portion.

Although the seal structure for the electronic control device according to the present invention has been explained on the basis of the above embodiment, the present invention is not limited to these embodiments.

For instance, the shapes of the auxiliary seal groove and the auxiliary protruding line are not limited to the above embodiment. An auxiliary seal groove and an auxiliary protruding line, having a recessed shape and a protruding shape respectively on surfaces of the seal groove 51 and the protruding line 52 so as to fit each other with a certain gap provided, could be used.

Figure 13A:
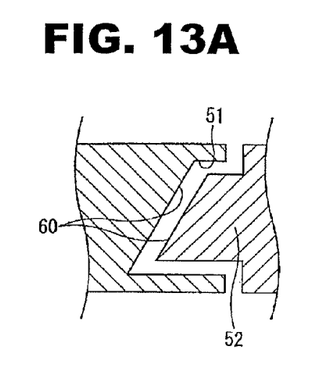
FIGS. 13A, 13B and 13C are drawings showing some shapes of an auxiliary seal groove and an auxiliary protruding line.
Figure 13B:
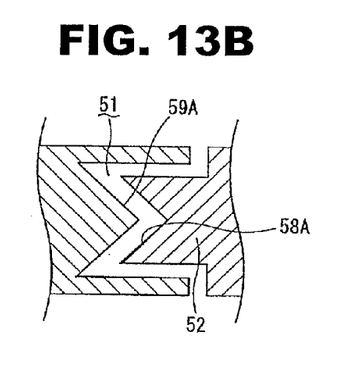
Figure 13C:
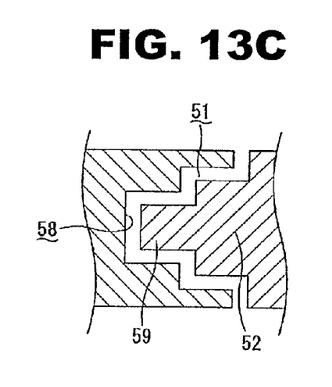

For example, as the shapes of the auxiliary seal groove and the auxiliary protruding line, as shown in FIG. 13A, such shape that an inclined surface 60 inclines with respect to opposing surfaces of the seal groove 51 and the protruding line 52, could be employed. Further, as shown in FIG. 13B, the seal groove 51 could be provided with a triangular auxiliary protruding line 59A which has a triangular shape in cross section and protrudes, and the protruding line 52 could be provided with an auxiliary seal groove 58A which has a triangularly hollow portion. FIG. 13C shows an example, like the present embodiment, in which the seal groove 51 is provided with the auxiliary seal groove 58 having a rectangularly hollow portion and the protruding line 52 is provided with the auxiliary protruding line 59 having a rectangular shape in cross section and protruding rectangularly.

The entire contents of Japanese Patent Application No. 2011-205474 filed on Sep. 21, 2011 are incorporated herein by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. A seal structure for an electronic control device having a circuit board housed in a watertight space of an inside of a housing that is formed by fitting a plurality of fitting members together, the seal structure comprising:
 first and second seal portions which are formed at a fitting surface portion between the fitting members that are fitted together, one side of a pair of the fitting members of each of the first and second seal portions being provided with a seal groove, the other side being provided with a protruding line, and a gap defined by fitting of the seal groove and the protruding line being filled with a sealant; and an auxiliary seal groove and an auxiliary protruding line which are formed on opposing surfaces of the seal groove of the second seal portion and the protruding line of the second seal portion at a merged part where the second seal portion is joined to the first seal portion at a predetermined angle, and are fitted together with a predetermined gap provided between the auxiliary seal groove and the auxiliary protruding line.

2. The seal structure for the electronic control device as claimed in claim 1, wherein:
- a connector fixed to one side of the circuit board is sandwiched between and by a pair of connector sandwiching members of the housing,
- a part of the connector is exposed to an outside of the housing and a remaining part of the connector and the circuit board are housed in the watertight space of the inside of the housing,
- the first seal portion is a housing seal portion formed at a fitting surface portion between a pair of the connector sandwiching members,
- the second seal portion is a connector seal portion formed at a fitting surface portion between an outer peripheral surface of the connector and an inner peripheral surface of the housing, and
- the auxiliary seal groove and the auxiliary protruding line are formed on the opposing surfaces of the seal groove and the protruding line at a merged part where a pair of the connector sandwiching members are fitted together at a circumference of the connector.

3. The seal structure for the electronic control device as claimed in claim 1, wherein:
- the auxiliary seal groove and the auxiliary protruding line at the merged part are set so that a quantity of the sealant filling the gap between the auxiliary seal groove and the auxiliary protruding line and a seal length of the gap at the merged part are substantially same as those of the gap between the seal groove and the protruding line except the merged part.

\* \* \* \* \*